(12) United States Patent
Igarashi et al.

(10) Patent No.: US 11,411,364 B2
(45) Date of Patent: Aug. 9, 2022

(54) LINE NARROWING MODULE, GAS LASER APPARATUS, AND ELECTRONIC DEVICE MANUFACTURING METHOD

(71) Applicant: Gigaphoton Inc., Tochigi (JP)

(72) Inventors: Miwa Igarashi, Oyama (JP); Shinichi Matsumoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/372,106

(22) Filed: Jul. 9, 2021

(65) Prior Publication Data

US 2021/0336407 A1 Oct. 28, 2021

Related U.S. Application Data

(63) Continuation of application No. PCT/JP2019/007315, filed on Feb. 26, 2019.

(51) Int. Cl.
*H01S 3/137* (2006.01)
*G03F 7/20* (2006.01)
(Continued)

(52) U.S. Cl.
CPC .......... *H01S 3/137* (2013.01); *G02B 26/0883* (2013.01); *G03F 7/70025* (2013.01);
(Continued)

(58) Field of Classification Search
CPC ............. G03F 7/70025; G03F 7/70191; G03F 7/7055; G03F 7/70575; G03F 7/70825;
(Continued)

(56) References Cited

U.S. PATENT DOCUMENTS

| 5,768,001 | A | * | 6/1998 | Kelley | G02B 26/10 359/17 |
| 7,672,067 | B2 | | 3/2010 | Kawanami | |

(Continued)

FOREIGN PATENT DOCUMENTS

| JP | H04-129119 U | 11/1992 |
| JP | H05283785 A * | 10/1993 |

(Continued)

OTHER PUBLICATIONS

International Search Report issued in PCT/JP2019/007315; dated May 21, 2019.
Written Opinion issued in PCT/JP2019/007315; dated May 21, 2019.

*Primary Examiner* — Peter B Kim

(74) *Attorney, Agent, or Firm* — Studebaker & Brackett PC

(57) ABSTRACT

A line narrowing module includes a prism including an entrance side surface that light enters, an exit side surface from which the light is emitted, and a bottom surface, and configured to wavelength-disperse the light having entered the entrance side surface and to emit the light from the exit side surface; a holder portion having a stationary surface on which the bottom surface of the prism is secured; a rotary mechanism portion including a rotary stage on which the holder portion is secured, the rotary stage being configured to rotate the prism around an axis perpendicular to a dispersion plane of the light emitted from the prism; a drive unit (Continued)

configured to rotate the rotary stage; and a grating configured to reflect the light emitted from the prism, centroids of the prism, the holder portion, and the rotary stage being located on the axis.

17 Claims, 14 Drawing Sheets

(51) Int. Cl.
  *H01S 3/08* (2006.01)
  *G02B 26/08* (2006.01)
  *H01S 3/034* (2006.01)
  *H01S 3/225* (2006.01)

(52) U.S. Cl.
  CPC .......... *H01S 3/08004* (2013.01); *H01S 3/034* (2013.01); *H01S 3/2251* (2013.01)

(58) Field of Classification Search
  CPC .......... H01S 3/0078; H01S 3/034; H01S 3/10; H01S 3/106; H01S 3/13; H01S 3/136; H01S 3/137; H01S 3/2251; H01S 3/036; H01S 3/08004; H01S 3/08009; H01S 3/0971; H01S 3/104; H01S 3/134; G02B 26/0883

USPC .................. 355/67, 71, 77; 372/29, 32, 102
  See application file for complete search history.

(56) References Cited

U.S. PATENT DOCUMENTS

| | | |
|---|---|---|
| 2003/0118072 A1 | 6/2003 | Wittak et al. |
| 2018/0107017 A1 | 4/2018 | Mason |
| 2019/0173258 A1 | 6/2019 | Miyamoto et al. |
| 2019/0181607 A1 | 6/2019 | Miyamoto et al. |

FOREIGN PATENT DOCUMENTS

| | | |
|---|---|---|
| JP | H05-96911 U | 12/1993 |
| JP | H06-4893 A | 1/1994 |
| JP | 2001-350006 A | 12/2001 |
| JP | 2005-352037 A | 12/2005 |
| JP | 2007-201121 A | 8/2007 |
| JP | 2015-175611 A | 10/2015 |
| JP | 2018-152465 A | 9/2018 |
| WO | 02/093699 A1 | 11/2002 |
| WO | 2018/061098 A1 | 4/2018 |
| WO | 2018/061210 A1 | 4/2018 |

* cited by examiner

LINE NARROWING MODULE, GAS LASER APPARATUS, AND ELECTRONIC DEVICE MANUFACTURING METHOD

CROSS-REFERENCE TO RELATED APPLICATIONS

The present application is a continuation application of International Application No. PCT/JP2019/007315, filed on Feb. 26, 2019, the entire contents of which are hereby incorporated by reference.

BACKGROUND

1. Technical Field

The present disclosure relates to a line narrowing module, a gas laser apparatus, and an electronic device manufacturing method.

2. Related Art

Recently, improvement in resolution of semiconductor exposure apparatuses (hereinafter referred to as "exposure apparatuses") has been desired due to miniaturization and high integration of semiconductor integrated circuits. For this purpose, exposure light sources that output light with shorter wavelengths have been developed. As the exposure light source, a gas laser apparatus is generally used in place of a conventional mercury lamp. For example, as a gas laser apparatus for exposure, a KrF excimer laser apparatus that outputs an ultraviolet laser beam having a wavelength of 248 nm and an ArF excimer laser apparatus that outputs an ultraviolet laser beam having a wavelength of 193 nm are used.

As next generation exposure technology, immersion exposure is practically used in which a gap between an exposure lens of an exposure apparatus and a wafer is filled with a liquid. In the immersion exposure, a refractive index between the exposure lens and the wafer changes to shorten an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure (or ArF immersion lithography).

The KrF excimer laser apparatus and the ArF excimer laser apparatus have a large natural oscillation range of about 350 to 400 pm. Thus, if a projection lens is made of a material that transmits ultraviolet light such as KrF and ArF laser beams, chromatic aberration may occur, thereby reducing resolution. Then, a spectral line width of a laser beam output from the gas laser apparatus needs to be narrowed to the extent that the chromatic aberration can be ignored. For this purpose, a line narrowing module (LNM) having a line narrowing element such as etalon or grating is sometimes provided in a laser resonator of the gas laser apparatus to narrow the spectrum line width. A laser apparatus in which the spectrum line width is narrowed is hereinafter referred to as a line narrowing laser apparatus.

LIST OF DOCUMENTS

Patent Documents

Patent Document 1: International Publication No. WO02/093699
Patent Document 2: U.S. Pat. No. 7,672,067
Patent Document 3: Japanese Unexamined Patent Application Publication No. 2018-152465

SUMMARY

One aspect of the present disclosure may be a line narrowing module including a prism including an entrance side surface that light enters, an exit side surface from which the light is emitted, and a bottom surface, and configured to wavelength-disperse the light having entered the entrance side surface and to emit the light from the exit side surface; a holder portion having a stationary surface on which the bottom surface of the prism is secured; a rotary mechanism portion including a rotary stage on which the holder portion is secured, the rotary stage being configured to rotate the prism around an axis perpendicular to a dispersion plane of the light emitted from the prism; a drive unit configured to rotate the rotary stage; and a grating configured to reflect the light emitted from the prism, a centroid of the prism, a centroid of the holder portion, and a centroid of the rotary stage being located on the axis.

Another aspect of the present disclosure may be a gas laser apparatus including a line narrowing module, the line narrowing module including a prism including an entrance side surface that light enters, an exit side surface from which the light is emitted, and a bottom surface, and configured to wavelength-disperse the light having entered the entrance side surface and to emit the light from the exit side surface, a holder portion having a stationary surface on which the bottom surface of the prism is secured, a rotary mechanism portion including a rotary stage on which the holder portion is secured, the rotary stage being configured to rotate the prism around an axis perpendicular to a dispersion plane of the light emitted from the prism, a drive unit configured to rotate the rotary stage, and a grating configured to reflect the light emitted from the prism, a centroid of the prism, a centroid of the holder portion, and a centroid of the rotary stage being located on the axis.

A further aspect of the present disclosure may be an electronic device manufacturing method including, in an exposure process, causing a laser beam emitted from a gas laser apparatus including a line narrowing module to enter an exposure apparatus; and exposing a photosensitive substrate to the laser beam within the exposure apparatus to manufacture an electronic device, the line narrowing module including a prism including an entrance side surface that light enters, an exit side surface from which the light is emitted, and a bottom surface, and configured to wavelength-disperse the light having entered the entrance side surface and to emit the light from the exit side surface, a holder portion having a stationary surface on which the bottom surface of the prism is secured, a rotary mechanism portion including a rotary stage on which the holder portion is secured, the rotary stage being configured to rotate the prism around an axis perpendicular to a dispersion plane of the light emitted from the prism, a drive unit configured to rotate the rotary stage, and a grating configured to reflect the light emitted from the prism, a centroid of the prism, a centroid of the holder portion, and a centroid of the rotary stage being located on the axis.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
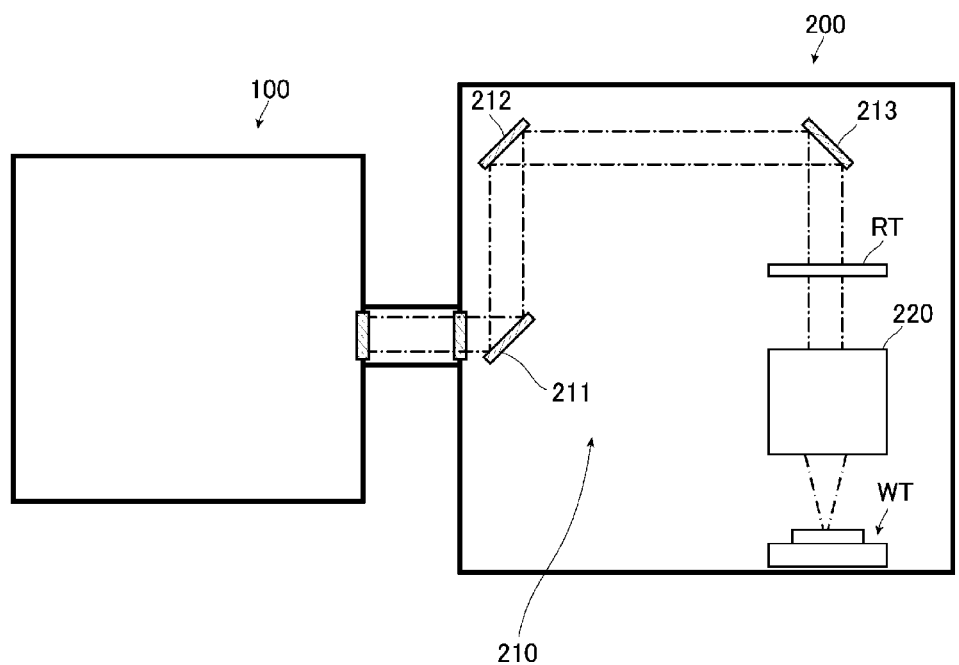
FIG. 1 is a schematic diagram of an exemplary configuration of the entire manufacturing device used in an exposure process in manufacture of an electronic device.

1. Description of manufacturing device used in exposure process in manufacture of electronic device
2. Description of gas laser apparatus of comparative example
   2.1 Configuration
   2.2 Operation
   2.3 Problem
3. Description of line narrowing module of Embodiment 1
   3.1 Configuration
   3.2 Operation
   3.3 Effect
4. Description of line narrowing module of Embodiment 2
   4.1 Configuration
   4.2 Effect
5. Description of line narrowing module of Embodiment 3
   5.1 Configuration
   5.2 Effect Now, with reference to the drawings, embodiments of the present disclosure will be described in detail.

The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Description of Manufacturing Device Used in Exposure Process in Manufacture of Electronic Device FIG. 1 is a schematic diagram of an exemplary configuration of the entire manufacturing device used in an exposure process in manufacture of an electronic device. As shown in FIG. 1, the manufacturing device used in the exposure process in manufacture of an electronic device includes a gas laser apparatus 100 and an exposure apparatus 200. The exposure apparatus 200 includes an illumination optical system 210 including a plurality of mirrors 211, 212, 213, and a projection optical system 220. The illumination optical system 210 illuminates, with a laser beam incident from the gas laser apparatus 100, a reticle pattern on a reticle stage RT. The projection optical system 220 reduces and projects the laser beam having passed though the reticle and forms an image thereof on a workpiece (not shown) arranged on a workpiece table WT. The workpiece is a photosensitive substrate such as a semiconductor wafer coated with photoresist. The exposure apparatus 200 synchronously translates the reticle stage RT and the workpiece table WT to expose the workpiece to the laser beam reflecting the reticle pattern. Through the exposure process as described above, a device pattern is transferred onto the semiconductor wafer, thereby manufacturing a semiconductor device as an electronic device.

2. Description of Gas Laser Apparatus of Comparative Example

2.1 Configuration

Figure 2:
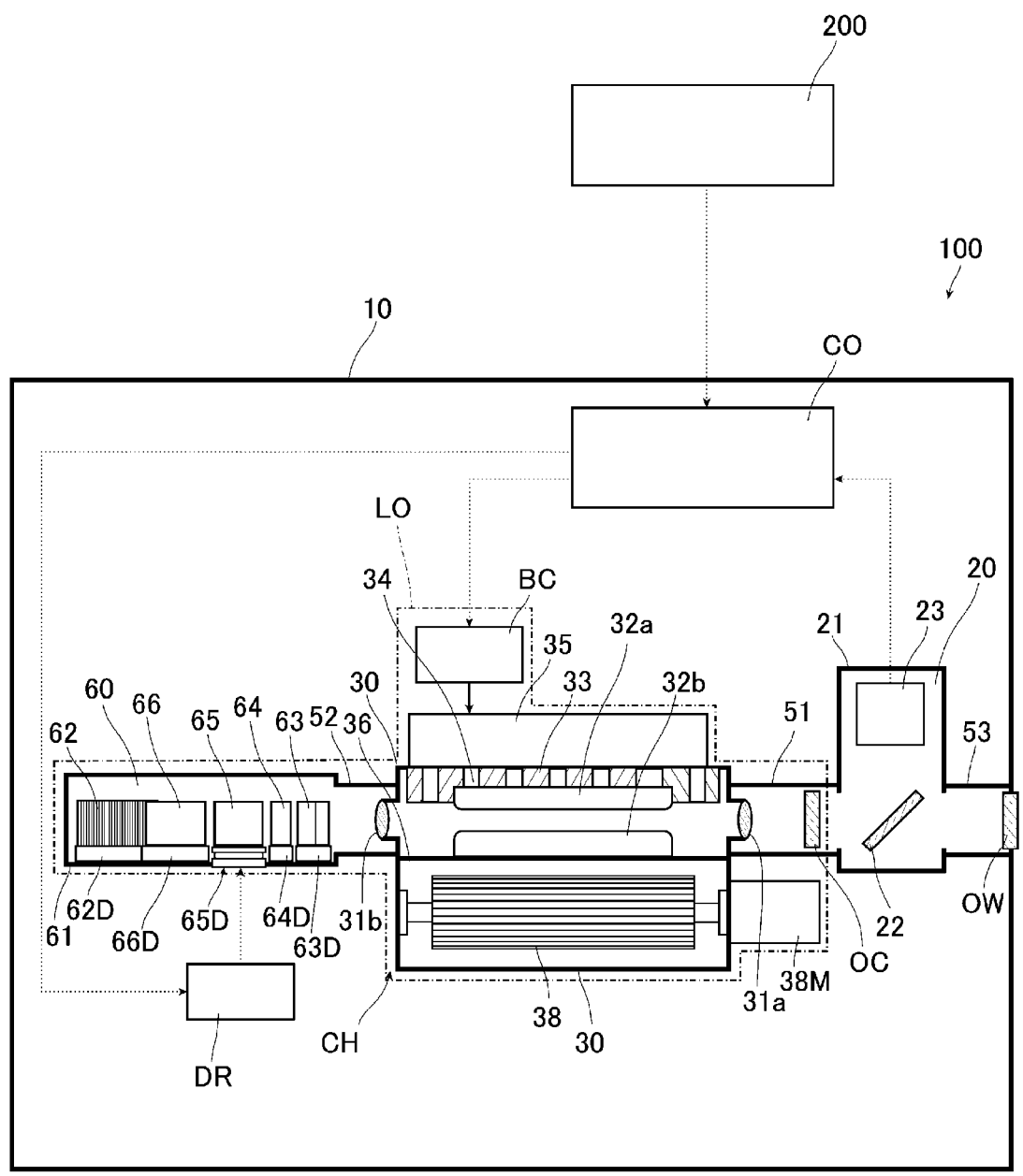
FIG. 2 is a schematic diagram of an exemplary configuration of the entire gas laser apparatus.

A gas laser apparatus of a comparative example will be described. FIG. 2 is a schematic diagram of an exemplary configuration of the entire gas laser apparatus of this example. As shown in FIG. 2, a gas laser apparatus 100 of this example mainly includes a casing 10, a laser oscillator LO, a wavelength measuring module 20, and a control unit CO. The gas laser apparatus 100 of this example is an ArF excimer laser apparatus using a mixed gas containing, for example, argon (Ar), fluorine ($F_2$), and neon (Ne). In this case, the gas laser apparatus 100 emits a pulse laser beam having a central wavelength of about 193 nm. The gas laser apparatus 100 may be a gas laser apparatus other than the ArF excimer laser apparatus, and for example, may be a KrF excimer laser apparatus using a mixed gas containing krypton (Kr), fluorine ($F_2$), and neon (Ne). In this case, the gas laser apparatus 100 emits a pulse laser beam having a central wavelength of about 248 nm. The mixed gas containing Ar, $F_2$, and Ne or the mixed gas containing Kr, $F_2$, and Ne as a laser medium is sometimes referred to as a laser gas.

The control unit CO can use, for example, an integrated circuit such as a microcontroller, an integrated circuit (IC), a large-scale integrated circuit (LSI), or an application specific integrated circuit (ASIC), or a numerical control (NC) device. When using the NC device, the control unit CO may or may not use a machine learning device. As described below, the control unit CO controls some components of the gas laser apparatus.

The laser oscillator LO mainly includes a chamber device CH, a charger BC, a line narrowing module 60, and an output coupling mirror OC.

The chamber device CH mainly includes a casing 30, a pair of windows 31a, 31b, a pair of electrodes 32a, 32b, an insulating portion 33, a pulse power module 35, an electrode holder portion 36, a cross flow fan 38, and a motor 38M.

The windows 31a, 31b are provided to face each other in the casing 30. The window 31a is provided at one end of the casing 30 in a traveling direction of the laser beam, and the window 31b is provided at the other end of the casing 30 in the traveling direction of the laser beam. As described later, in the gas laser apparatus 100, light oscillates in an optical path including the casing 30 to emit the laser beam, and thus the laser beam generated in the casing 30 is emitted through the windows 31a, 31b to the outside of the casing 30. Each of the windows 31a, 31b is tilted at a Brewster angle with respect to the traveling direction of the laser beam to suppress reflection of a P polarized laser beam. The windows 31a, 31b are made, for example, of calcium fluoride. The windows 31a, 31b may be coated with a fluoride or oxide film.

The casing 30 is filled with an ArF gas as a laser gas. The laser gas is supplied through a pipe from a laser gas supply source (not shown) arranged in the casing 10. In this example, for example, the laser gas supply source supplies a mixed gas containing $F_2$, Ar, and Ne. In the case of a KrF excimer laser, the laser gas supply source supplies, for example, a mixed gas containing $F_2$, Kr, and Ne.

A longitudinal direction of the electrodes 32a, 32b is along the traveling direction of the laser beam, and the electrodes 32a, 32b are arranged to face each other in the casing 30. A space between the electrodes 32a, 32b in the casing 30 is located between the windows 31a, 31b. The electrodes 32a, 32b are discharge electrodes for exciting a laser medium by glow discharge. In this example, the electrode 32a is a cathode and the electrode 32b is an anode.

The casing 30 has an opening, which is closed by the insulating portion 33 including an insulator. The electrode 32a is supported by the insulating portion 33. A feedthrough 34 formed of a conductive member is embedded in the insulating portion 33. The feedthrough 34 applies a voltage supplied from the pulse power module 35 to the electrode 32a. The electrode 32b is supported by and electrically connected to the electrode holder portion 36. The electrode holder portion 36 is electrically connected to the casing 30 by a wire (not shown).

The charger BC arranged outside the casing 30 is connected to the pulse power module 35. The charger BC is a DC power supply device that charges a capacitor (not shown) provided in the pulse power module 35 with a predetermined voltage. The pulse power module 35 includes a switch controlled by the control unit CO. When the switch is turned on, the pulse power module 35 increases the voltage applied from the charger BC to generate a pulsed high voltage, and applies the high voltage between the electrodes 32a, 32b.

The cross flow fan 38 is arranged in a space on a side of the electrode holder portion 36 opposite to the electrode 32b in the casing 10. The space in which the cross flow fan 38 is arranged communicates with the space between the electrodes 32a, 32b in the casing 30. Thus, the cross flow fan 38 rotates to circulate the laser gas filling the casing 30 in a predetermined direction. The motor 38M arranged outside the casing 30 is connected to the cross flow fan 38. The motor 38M rotates to rotate the cross flow fan 38. The motor 38M is turned on/off or adjusted in rotation speed by control with the control unit CO. Thus, the control unit CO can control the motor 38M to adjust a circulation speed of the laser gas circulating in the casing 30.

A heat exchanger (not shown) is arranged beside the cross flow fan 38. At least part of the laser gas circulated by the cross flow fan 38 passes through the heat exchanger, and is adjusted in temperature by the heat exchanger.

An optical path tube 51 is connected to the one end of the casing 30 at which the window 31a is provided. The output coupling mirror OC is provided on the one end side of the casing 30, and arranged in the optical path tube 51. The output coupling mirror OC is an optical element that the laser beam emitted through the window 31a enters. The output coupling mirror OC transmits one part of the laser beam emitted through the window 31a, and reflects and returns the other part through the window 31a into the casing 30. The output coupling mirror OC is formed, for example, of an element including a calcium fluoride substrate coated with a dielectric multilayer film.

An optical path tube 52 is connected to the other end of the casing 30 at which the window 31b is provided. A line narrowing module 60 is connected to the optical path tube 52. Thus, the line narrowing module 60 is provided on the other end side of the casing 30. The line narrowing module 60 includes a casing 61, a grating 62, and prisms 63 to 66.

Figure 3:
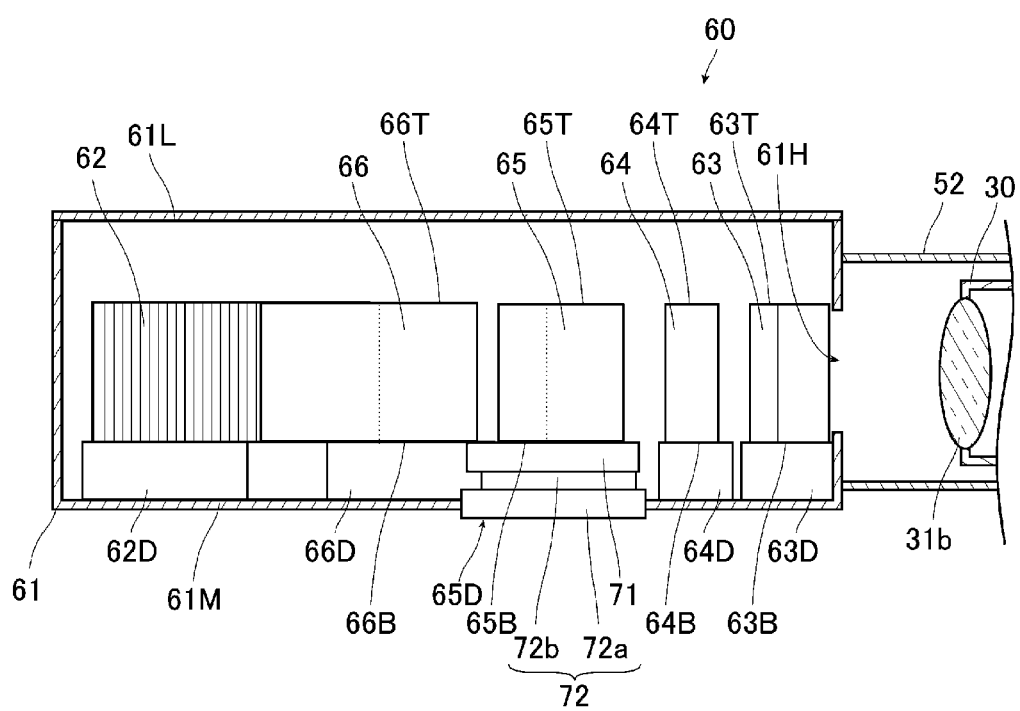
FIG. 3 is an enlarged view of a line narrowing module in FIG. 2.
Figure 4:
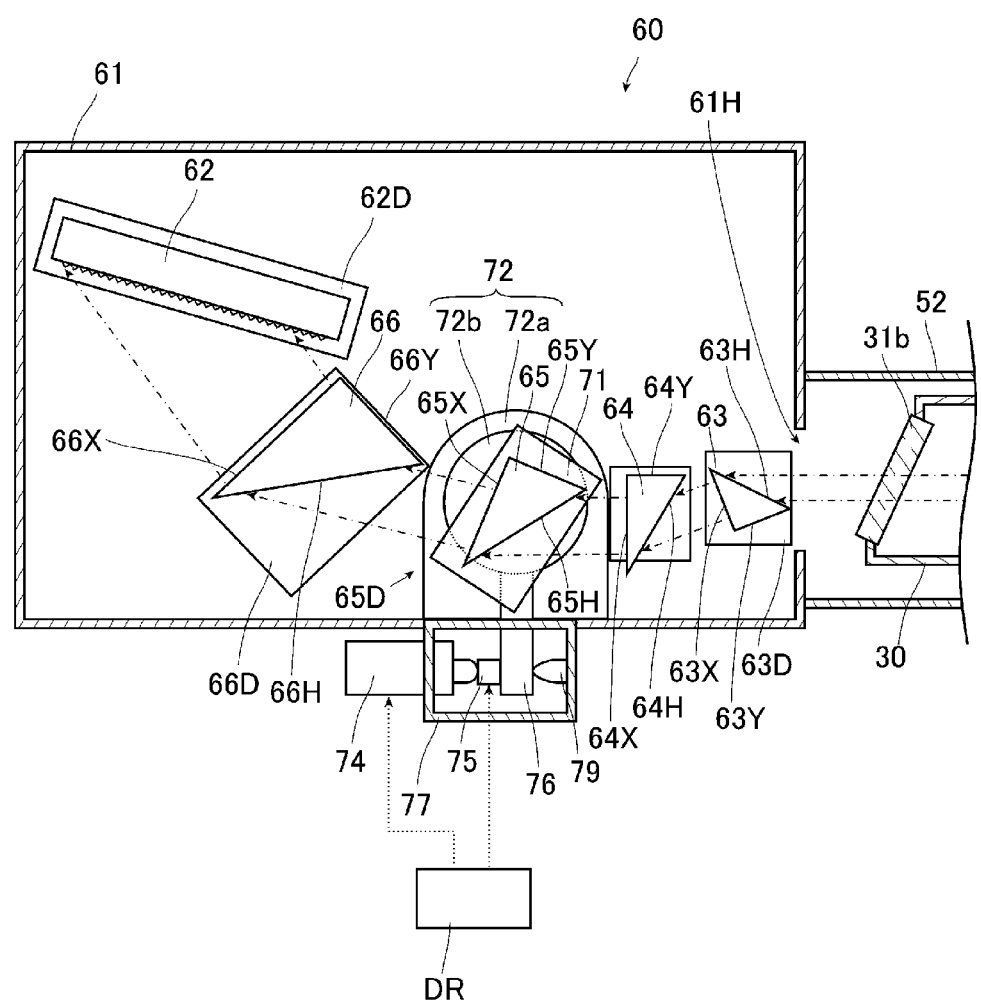
FIG. 4 shows the line narrowing module viewed in a direction orthogonal to that in FIG. 2.

FIG. 3 is an enlarged view of the line narrowing module 60 in FIG. 2. FIG. 4 shows the line narrowing module 60 viewed in a direction orthogonal to that in FIG. 2. Specifically, FIG. 4 shows the line narrowing module 60 viewed in a direction of alignment of the electrodes 32a, 32b. The casing 61 includes a body 61M and a lid 61L. The body 61M of the casing 61 has an opening 61H, through which a space in the casing 61 communicates with a space in the optical path tube 52.

The grating 62 and the prisms 63 to 66 are arranged in the casing 61. The grating 62 and the prisms 63 to 66 are optical elements that the laser beam emitted through the window 31b enters. The grating 62 is configured in a Littrow arrangement such that a wavelength dispersion surface substantially matches a plane perpendicular to a propagating direction of the laser beam and that an incident angle of the laser beam substantially matches a diffraction angle thereof. In this example, the grating 62 may be an echelle grating blazed for a wavelength of about 193 nm. The grating 62 is secured on a grating securing holder portion 62D, which is secured on the casing 61. Thus, the grating 62 is immovable relative to the casing 61.

The prisms 63 to 66 in this example each have a shape of a triangular pole, and specifically, have a shape of a right-angled triangular pole with right-angled triangular bottom surfaces. The prism 63 includes a pair of bottom surfaces 63B, 63T and side surfaces 63H, 63X, 63Y perpendicular to the bottom surface 63B. The side surface 63H includes hypotenuses of the bottom surfaces 63B, 63T, and the side surfaces 63X, 63Y are perpendicular to each other. The prism 64 includes a pair of bottom surfaces 64B, 64T and side surfaces 64H, 64X, 64Y perpendicular to the bottom surface 64B. The side surface 64H includes hypotenuses of the bottom surfaces 64B, 64T, and the side surfaces 64X, 64Y are perpendicular to each other. The prism 65 includes a pair of bottom surfaces 65B, 65T and side surfaces 65H, 65X, 65Y perpendicular to the bottom surface 65B. The side surface 65H includes hypotenuses of the bottom surfaces 65B, 65T, and the side surfaces 65X, 65Y are perpendicular to each other. The prism 66 includes a pair of bottom surfaces 66B, 66T and side surfaces 66H, 66X, 66Y perpendicular to the bottom surface 66B. The side surface 66H includes hypotenuses of the bottom surfaces 66B, 66T, and the side surfaces 66X, 66Y are perpendicular to each other.

The prisms 63 to 66 are made, for example, of calcium fluoride. The prisms 63 to 66 each include an entrance side surface that light enters and an exit side surface from which the light is emitted, and wavelength-disperse the light having entered the entrance side surface to emit the light from the exit side surface. In this example, light propagating from the chamber device CH enters the side surfaces 63H to 66H of the prisms 63 to 66. The light having entered each of the side surfaces 63H to 66H of the prisms 63 to 66 is emitted from each of the side surfaces 63X to 66X of the prisms 63 to 66. Thus, for the light entering from the chamber device CH, the side surfaces 63H to 66H of the prisms 63 to 66 are the entrance side surfaces, and the side surfaces 63X to 66X are the exit side surfaces. On the other hand, light propagating from the grating 62 enters the side surfaces 63X to 66X of the prisms 63 to 66. The light having entered each of the side surfaces 63X to 66X of the prisms 63 to 66 is emitted from each of the side surfaces 63H to 66H of the prisms 63 to 66. Thus, for the light propagating from the grating 62, the side surfaces 63X to 66X of the prisms 63 to 66 are the entrance side surfaces, and the side surfaces 63H to 66H are the exit side surfaces.

In this example, the prism 63 is secured on a prism holder 63D with one bottom surface 63B facing the prism holder 63D. The prism 64 is secured on a prism holder 64D with one bottom surface 64B facing the prism holder 64D. The prism 66 is secured on a prism holder 66D with one bottom surface 66B facing the prism holder 66D. The prism holders 63D, 64D, 66D are secured on the casing 61. Thus, the prisms 63, 64, 66 are immovable relative to the casing 61 and the grating 62. The prism 65 is secured on a prism holder 65D. The prism holder 65D slightly rotates the prism 65 around an axis perpendicular to a dispersion plane of light emitted from the prism 65. Details of the prism holder 65D will be described later.

The prism 65 is slightly rotated and changed in orientation, which changes a direction of the light emitted from the prism 65 and adjusts an incident angle of the light entering the grating 62. The incident angle of the light on the grating 62 is adjusted to adjust a reflection angle of the light reflected by the grating 62. Thus, the light emitted through the window 31b in the casing 30 is reflected by the grating 62 through the prisms 63 to 66, and again returned through the prisms 63 to 66 to the window 31b in the casing 30, thereby adjusting a wavelength of the light entering the casing 30 to a desired wavelength. In this example, the four prisms are arranged in the line narrowing module 60, but three or less or five or more prisms may be arranged as long as they include at least one rotating prism like the prism 65.

The output coupling mirror OC and the grating 62 with the casing 30 therebetween constitute an optical resonator, and the casing 30 is arranged in an optical path of the optical resonator. Thus, the light emitted from the casing 30 reciprocates between the grating 62 in the line narrowing module 60 and the output coupling mirror OC and is amplified every time it passes through a laser gain space between the electrodes 32a, 32b. Part of the amplified light passes through the output coupling mirror OC and is emitted as a pulse laser beam.

The wavelength measuring module 20 is arranged in an optical path of the pulse laser beam emitted from the output coupling mirror OC in the laser oscillator LO. The wavelength measuring module 20 includes a casing 21, a beam splitter 22, and a wavelength monitor 23. The casing 21 is connected to the optical path tube 51. The beam splitter 22 and the wavelength monitor 23 are optical elements that the laser beam emitted through the window 31a enters. The casing 21 has an opening, through which a space in the casing 21 communicates with a space in the optical path tube 51. The beam splitter 22 and the wavelength monitor 23 are arranged in the casing 21.

The beam splitter 22 transmits the pulse laser beam emitted from the laser oscillator LO with high transmittance, and reflects part of the pulse laser beam toward a light receiving surface of the wavelength monitor 23. The wavelength monitor 23 detects a wavelength of the pulse laser beam having entered the light receiving surface, and outputs data of the detected wavelength to the control unit CO.

An opening is formed on a side of the casing 21 of the wavelength measuring module 20 opposite to the side to which the optical path tube 51 is connected, and an optical path tube 53 is connected to surround the opening. Thus, the space in the optical path tube 51, the space in the casing 21, and a space in the optical path tube 53 communicate with each other. The optical path tube 53 is connected to the casing 10. A laser beam exit window OW is provided in a position of the casing 10 surrounded by the optical path tube 53. Thus, the laser beam passing through the beam splitter 22 in the wavelength measuring module 20 is emitted through the optical path tube 53 and through the laser beam exit window OW to the outside of the casing 10.

The optical path tubes 51, 52, 53 and the casings 21, 61 are filled with a purge gas. The purge gas contains an inert gas such as high purity nitrogen containing few impurities such as oxygen. The purge gas is supplied from a purge gas supply source (not shown) arranged outside the casing 10 through pipes (not shown) into the optical path tubes 51, 52, 53 and the casings 21, 61.

An exhaust device (not shown) for exhausting the laser gas exhausted from the casing 30 of the chamber device CH is arranged in the casing 10. The exhaust device removes an $F_2$ gas from the gas exhausted from the casing 30 using a halogen filter, and releases the gas into the casing 10.

Figure 5:
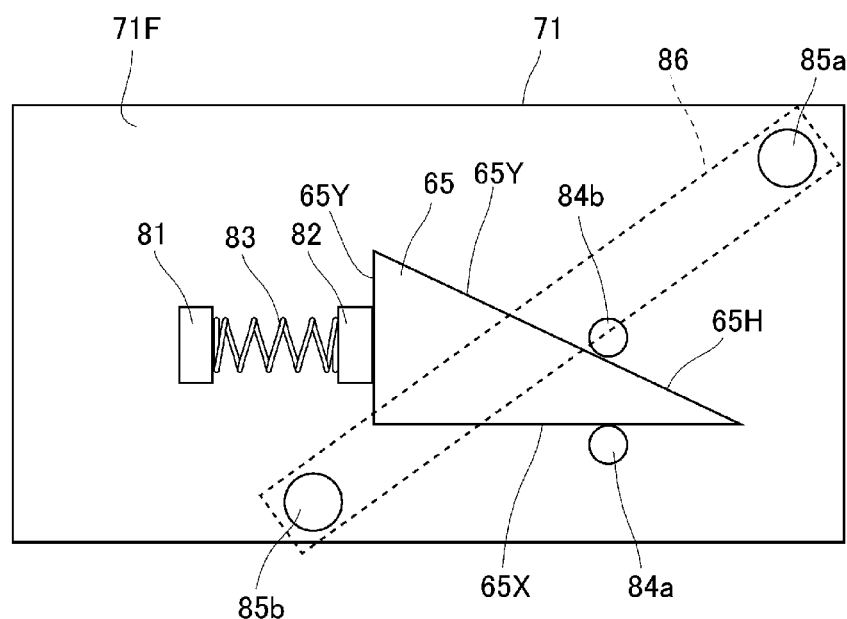
FIG. 5 shows a prism being secured on a holder portion viewed along a side surface of the prism.
Figure 6:
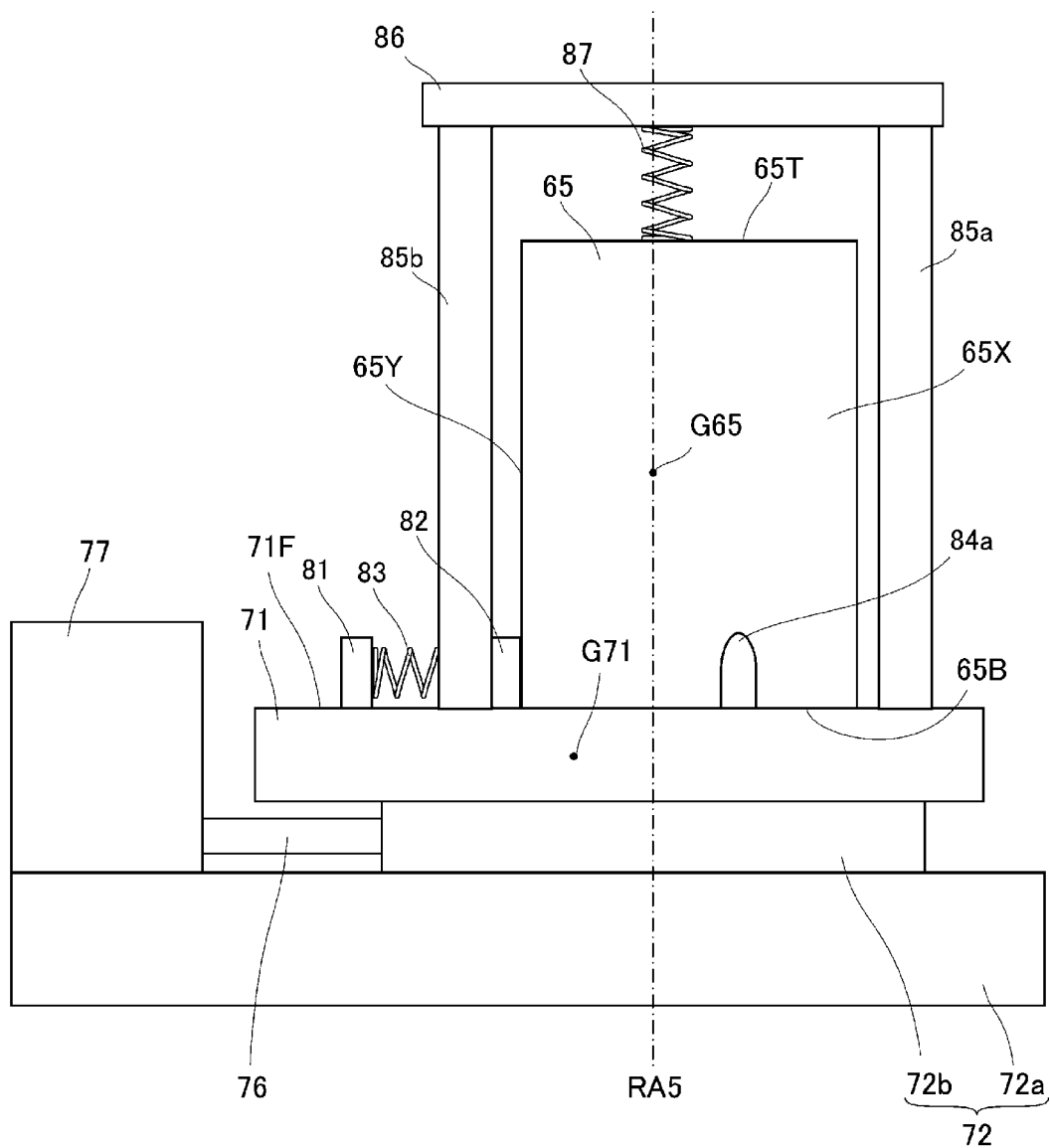
FIG. 6 shows the prism being secured on the holder portion viewed in a direction perpendicular to the side surface of the prism.

Next, details of the prism holder 65D will be described. As shown in FIGS. 3 and 4, the prism holder 65D includes a holder portion 71 and a rotary mechanism portion 72. The prism 65 is secured on the holder portion 71. FIG. 5 shows the prism 65 being secured on the holder portion 71 viewed along the side surfaces of the prism 65. FIG. 6 shows the prism 65 being secured on the holder portion 71 viewed in a direction perpendicular to the side surface 65X of the prism 65. As shown in FIGS. 5 and 6, the holder portion 71 is a plate-like member and has generally rectangular main surfaces. One of the main surfaces of the holder portion 71 is a stationary surface 71F on which the prism 65 is secured. A stationary wall 81 is secured on the stationary surface 71F, and a spring 83 is mounted to a side surface of the stationary wall 81. A mobile wall 82 is mounted to the side of the spring 83 opposite to the stationary wall 81. A pair of ribs 84a, 84b are secured on the stationary surface 71F. A pair of columns 85a, 85b are secured on the stationary surface 71F, and a beam 86 spanning the columns 85a, 85b is secured on ends of the columns 85a, 85b opposite to the stationary surface 71F. The beam 86 is generally parallel to the stationary surface 71F. A spring 87 is mounted to the beam 86 on the side of the stationary surface 71F. In FIGS. 3 and 4, members other than the prism 65 on the holder portion 71 are not shown.

The prism 65 is arranged in a position overlapping the beam 86 on the stationary surface 71F of the holder portion 71 with one bottom surface 65B being in contact with the stationary surface 71F, the side surface 65X being in contact with the rib 84a, and the side surface 65H being in contact with the rib 84b. The mobile wall 82 presses the side surface 65Y by an elastic force of the spring 83, and the spring 87 presses the other bottom surface 65T. Thus, with the prism 65 being pressed against the stationary surface 71F by the spring 87, the prism 65 is restricted in movement along an in-plane direction of the stationary surface 71F and secured on the holder portion 71.

The holder portion 71 is secured on the rotary mechanism portion 72. The rotary mechanism portion 72 in this example includes a stationary plate 72a and a rotary stage 72b, and the holder portion 71 is secured on the rotary stage 72b. The stationary plate 72a is secured on the body 61M of the casing 61. The rotary stage 72b is a circular plate-like member, and rotates around a predetermined axis in an in-plane direction of a main surface of the stationary plate 72a. The stationary plate 72a and the rotary stage 72b are connected, for example, by a cross roller bearing. The in-plane direction of the main surface of the stationary plate 72a is parallel to the bottom surface 65B of the prism 65. Thus, an axis RA5 around which the rotary stage 72b rotates is perpendicular to a dispersion plane of light emitted from the prism 65. When the rotary stage 72b rotates, the holder portion 71 secured on the rotary stage 72b and the prism 65 secured on the holder portion 71 rotate together with the rotary stage 72b around the axis RA5 perpendicular to the dispersion plane of the light emitted from the prism 65. In this example, with the prism 65 being secured on the holder portion 71, a centroid G65 of the prism 65 is located on the axis RA5 around which the prism 65 rotates.

The stationary plate 72a protrudes outward from inside the casing 61. A casing 77 is provided on the stationary plate 72a outside the casing 61. A space in the casing 77 communicates with a space in the casing 61 to maintain airtightness. A stepping motor 74 is secured on the stationary plate 72a outside the casing 61. The stepping motor 74 includes a specific shaft, and one end of the shaft is located in the casing 77. The shaft is moved in a longitudinal direction by operation of the stepping motor 74.

A piezo actuator 75 is movably arranged in the casing 77. The piezo actuator 75 is in contact with the one end of the shaft of the stepping motor 74. Thus, the shaft of the stepping motor 74 is moved to move the piezo actuator 75.

A lever 76 is connected to the rotary stage 72b. The lever 76 protrudes outward from inside the casing 61, and an end of the lever 76 opposite to the rotary stage 72b is located in the casing 77. The piezo actuator 75 is in contact with the lever 76. Thus, the piezo actuator 75 is held between the shaft of the stepping motor 74 and the lever 76, and when the piezo actuator 75 is operated, a piezoelectric effect changes a distance between the end of the shaft of the stepping motor 74 and the lever 76. The lever 76 is in contact with a plunger 79 on a side opposite to the side in contact with the piezo actuator 75. The plunger 79 is secured to the casing 77 and presses the lever 76. Thus, the lever 76 is held between the piezo actuator 75 and the plunger 79 and pressed by the piezo actuator 75 and the plunger 79. A tilt of the lever 76 is changed by movement of the piezo actuator 75 due to the operation of the stepping motor 74, or a change in distance between the end of the shaft of the stepping motor 74 and the lever 76 due to the operation of the piezo actuator 75. The tilt of the lever 76 is changed to rotate the rotary stage 72b. Thus, in this example, each of the stepping motor 74 and the piezo actuator 75 serves as the drive unit that rotates the rotary stage 72b. The change in tilt of the lever 76 due to the operation of the piezo actuator 75 is smaller than that due to the operation of the stepping motor 74. In other words, the stepping motor 74 is a drive unit for coarse motion and the piezo actuator 75 is a drive unit for fine motion. Thus, the stepping motor 74 is operated to coarsely adjust an optical path, and the piezo actuator 75 is operated to finely adjust the optical path.

A driver DR is electrically connected to the stepping motor 74 and the piezo actuator 75. The driver DR drives the stepping motor 74 and the piezo actuator 75 according to a signal from the control unit CO.

An exposure apparatus 200 inputs, to the control unit CO, a signal relating to a wavelength of light to be emitted from the gas laser apparatus 100.

2.2 Operation

Next, an operation of the gas laser apparatus 100 of the comparative example will be described.

Before the gas laser apparatus 100 emits a laser beam, the optical path tubes 51, 52, 53 and the casings 21, 61 are filled with a purge gas supplied from the purge gas supply source (not shown). Also, a laser gas is supplied from the laser gas supply source (not shown) into the casing 30. When the laser gas is supplied, the control unit CO controls the motor 38M to rotate the cross flow fan 38, and the cross flow fan 38 rotates to circulate the laser gas.

For emitting the laser beam from the gas laser apparatus 100, the control unit CO controls the charger BC and the switch in the pulse power module 35 to apply a high voltage between the electrodes 32a, 32b. When the high voltage is applied between the electrodes 32a, 32b, insulation between the electrodes 32a, 32b is broken to cause discharge. By energy of the discharge, a laser medium contained in the laser gas between the electrodes 32a, 32b is excited to cause spontaneous emission when returning to the ground state. Part of the light is emitted through the window 31b, and reflected by the grating 62 through the prisms 63 to 66. The light is wavelength-dispersed when it passes through each of the prisms 63 to 66. The light reflected by the grating 62 propagates through the prisms 63 to 66 and again through the window 31b into the casing 30. The light propagating into the casing 30 is line narrowed. With the line narrowed light, the excited laser medium causes stimulated emission to amplify the light. As such, the light having a predetermined wavelength resonates between the grating 62 and the output coupling mirror OC to cause laser oscillation. Then, part of the laser beam passes through the output coupling mirror OC and is emitted through the laser beam exit window OW.

At this time, the laser beam reflected by the beam splitter 22 is received by the wavelength monitor 23, and the wavelength monitor 23 outputs, to the control unit CO, a signal according to the wavelength of the received laser beam. The exposure apparatus 200 inputs, to the control unit CO, the signal relating to the wavelength of the light. Thus, the control unit CO controls the driver DR according to the signal received from the wavelength monitor 23 and the signal received from the exposure apparatus 200, and the driver DR drives the stepping motor 74 and the piezo actuator 75. The stepping motor 74 and the piezo actuator 75 are driven to change the tilt of the lever 76, thereby rotating the rotary stage 72b. A rotation angle is, for example, in the range of ±2.5 degrees. The rotary stage 72b rotates to rotate the holder portion 71 secured on the rotary stage 72b and the prism 65 secured on the holder portion 71 together with the rotary stage 72b, thereby changing the orientation of the prism 65.

The orientation of the prism 65 is changed to adjust a wavelength of the light reflected by the grating 62 and returning into the casing 30 of the chamber device CH. In other words, the control unit CO adjusts a rotation angle of the prism 65 according to the signal from the wavelength monitor 23 and the signal from the exposure apparatus 200, and performs feedback control such that the light emitted from the gas laser apparatus 100 has a wavelength desired by the exposure apparatus 200.

2.3 Problem

In the gas laser apparatus 100 of the comparative example, the centroid G65 of the prism 65 is located on the axis RA5 around which the rotary stage 72b rotates as described above, which suppresses whirling of the prism 65 due to rotation. However, the plurality of members for securing the prism 65 are arranged on the holder portion 71, which tends to increase a size of the holder portion 71. Thus, a centroid G71 of the holder portion 71 is located other than on the axis RA5 around which the rotary stage 72b rotates. Thus, the holder portion 71 rotates to cause whirling, and a rotation response of the holder portion 71 tends to be slow. Thus, a rotation response of the prism 65 secured on the holder portion 71 also tends to be slow. In particular, the operation of the piezo actuator 75 due to the piezoelectric effect is fast, and there is a concern that rotating operation of the holder portion 71 does not follow the operation of the piezo actuator 75. If the rotation response of the holder portion 71 is thus slow, the rotation response of the prism 65 becomes slow, and there is a concern that the wavelength of the laser beam emitted from the gas laser apparatus 100 becomes unstable.

Then, embodiments below exemplify a line narrowing module that can achieve a gas laser apparatus capable of stabilizing a wavelength of a laser beam.

3. Description of Line Narrowing Module of Embodiment 1

Next, a line narrowing module of Embodiment 1 will be described. The same components as those described above are denoted by the same reference numerals, and overlapping descriptions are omitted unless otherwise stated.

3.1 Configuration

Figure 7:
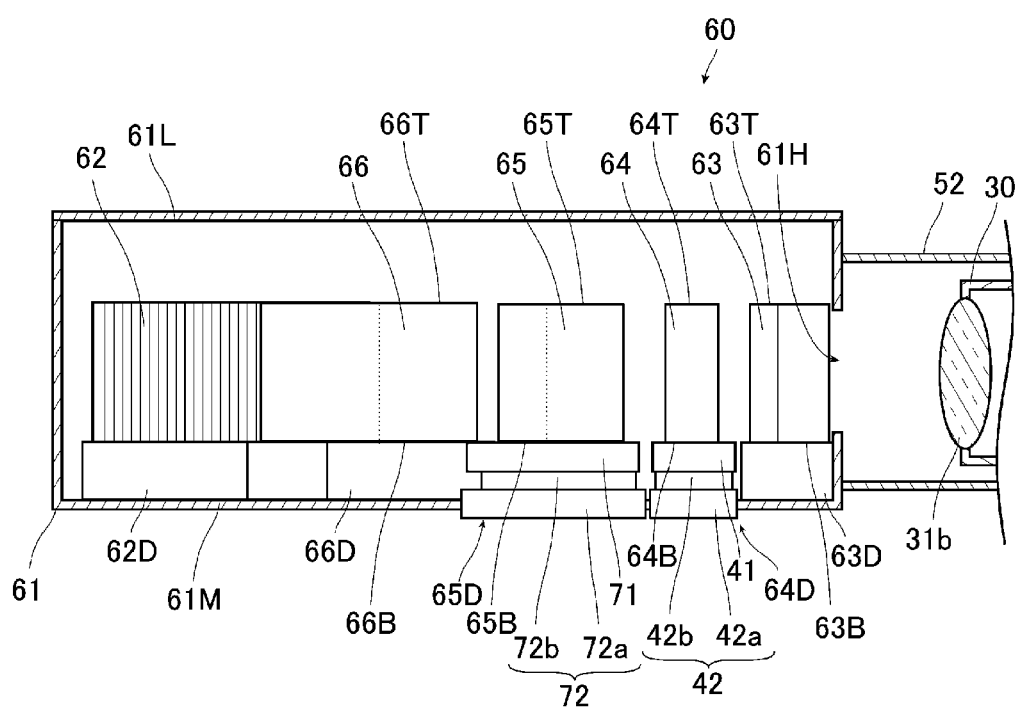
FIG. 7 shows a line narrowing module of Embodiment 1 in the same manner as in FIG. 3.
Figure 8:
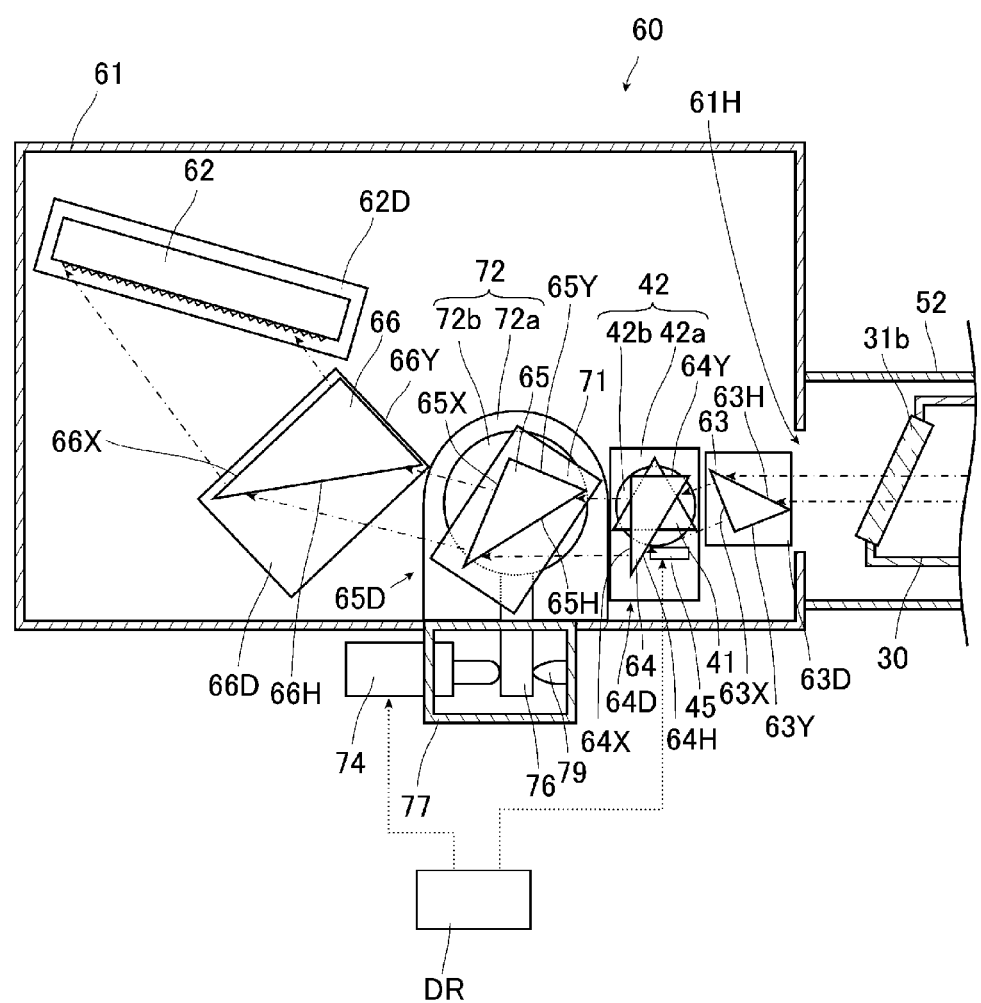
FIG. 8 shows the line narrowing module of Embodiment 1 in the same manner as in FIG. 4.

FIG. 7 shows a line narrowing module of this embodiment in the same manner as in FIG. 3. FIG. 8 shows the line narrowing module of this embodiment in the same manner as in FIG. 4. As shown in FIGS. 7 and 8, the line narrowing module 60 of this embodiment is different from the line narrowing module 60 of the comparative example in that a prism 64 slightly rotates around an axis perpendicular to a dispersion plane of light emitted from the prism 64. Thus, a prism holder 64D in this embodiment includes a configuration for slightly rotating the prism 64. A configuration for rotating a prism 65 in this embodiment is different from that in the comparative example.

First, the configuration for rotating the prism 65 in this embodiment will be described.

As shown in FIG. 8, in this embodiment, a shaft of a stepping motor 74 is in contact with a lever 76, and no piezo actuator 75 is provided. Thus, in this embodiment, the stepping motor 74 is a drive unit that rotates a rotary stage 72b. As described above, the stepping motor 74 is a drive unit for coarse motion, and the piezo actuator 75 is a drive unit for fine motion, and thus an orientation of the prism 65 in this embodiment is more coarsely adjusted than that in the comparative example.

Next, details of the prism holder 64D in this embodiment will be described.

Figure 9:
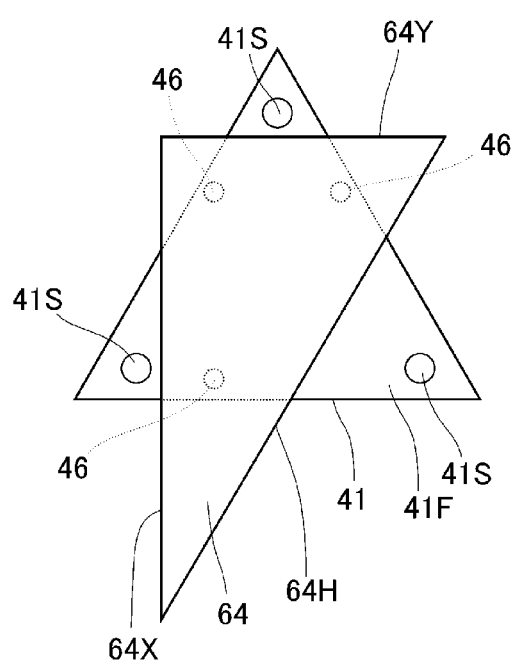
FIG. 9 shows a prism being secured on a holder portion viewed along a side surface of the prism.
Figure 10:
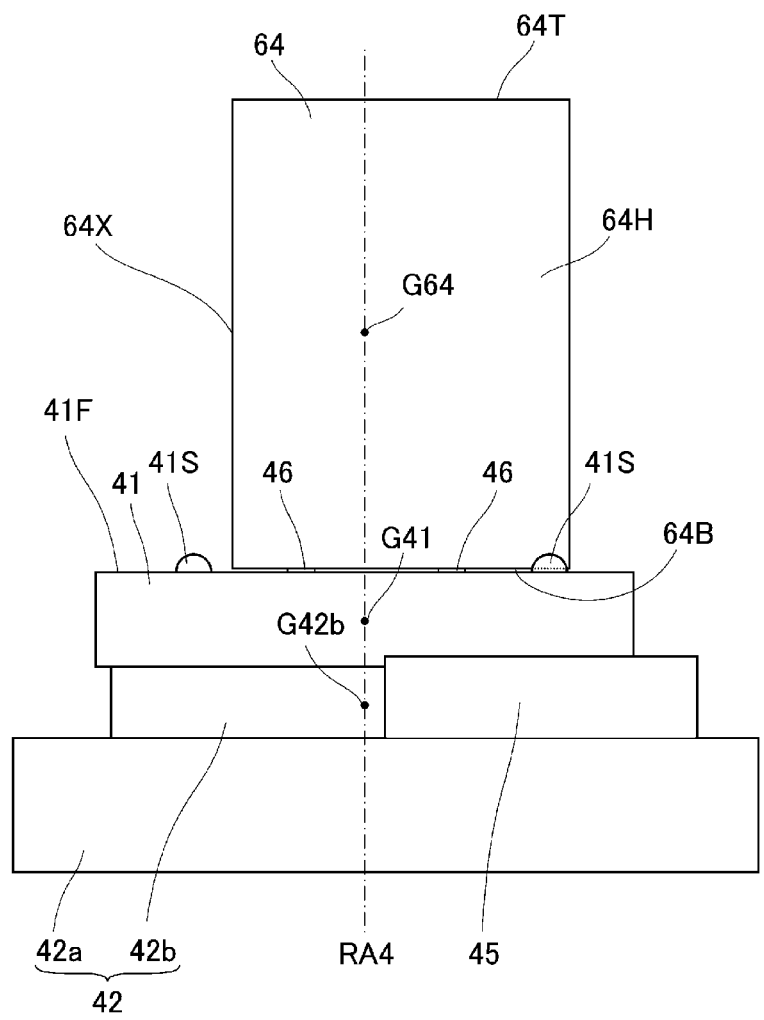
FIG. 10 shows the prism being secured on the holder portion viewed in a direction perpendicular to the side surface of the prism.

In the line narrowing module 60 of this embodiment, the prism holder 64D includes a holder portion 41 and a rotary mechanism portion 42. The prism 64 is secured on the holder portion 41. FIG. 9 shows the prism 64 being secured on the holder portion 41 viewed along side surfaces of the prism 64. FIG. 10 shows the prism 64 being secured on the holder portion 41 viewed in a direction perpendicular to a side surface 64Y of the prism 64. As shown in FIGS. 9 and 10, the holder portion 41 is a plate-like member and has generally equilateral triangular main surfaces. One of the main surfaces of the holder portion 41 is a stationary surface 41F on which the prism 64 is secured. The stationary surface 41F in this embodiment has a planar shape. The prism 64 is secured on the holder portion 41 with an adhesive 46 such that one bottom surface 64B facing the stationary surface 41F and that apexes of the triangular bottom surface 64B protrude from the stationary surface 41F and do not overlap the stationary surface 41F.

Figure 11:
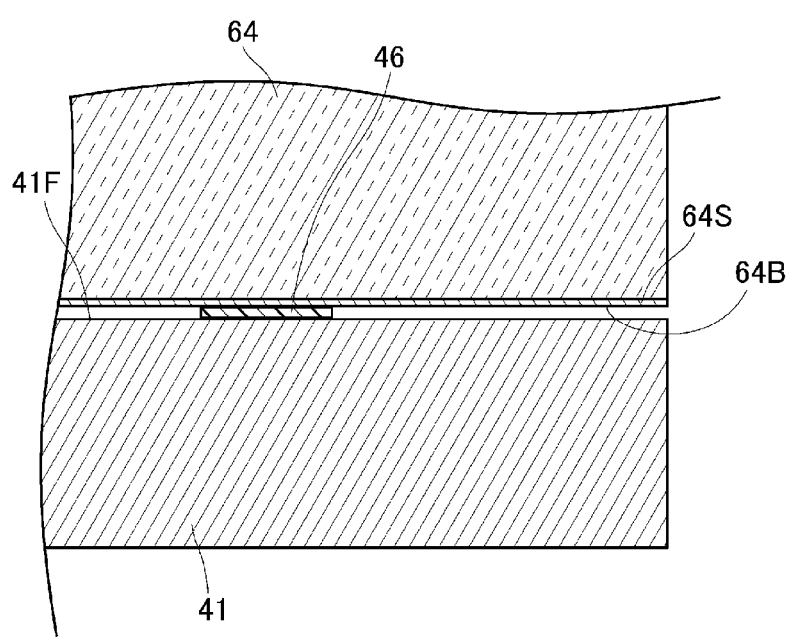
FIG. 11 is a sectional view of the prism and the holder portion being secured with an adhesive.

The adhesive 46 is separated into a plurality of dot-like adhesive portions, and in this embodiment, separated into three adhesive portions equal to the number of apexes of the bottom surface 64B of the prism 64. FIG. 11 is a sectional view of the prism 64 and the holder portion 41 being secured with the adhesive 46. As shown in FIG. 11, the adhesive 46 is arranged between the bottom surface 64B of the prism 64 and the stationary surface 41F, and thus the bottom surface 64B of the prism 64 is spaced apart from the stationary surface 41F by the adhesive 46. Thus, a space is formed in a region where the adhesive 46 is not arranged between the bottom surface 64B of the prism 64 and the stationary surface 41F.

The prism 64 in this embodiment includes a light shielding film 64S. The light shielding film 64S is provided on one bottom surface 64B. Thus, the bottom surface 64B of the prism 64 is a surface of the light shielding film 64S. The light shielding film 64S suppresses transmission of light emitted from a chamber device CH. The light shielding film 64S is made, for example, of an aluminum vapor-deposited film.

Figure 12:
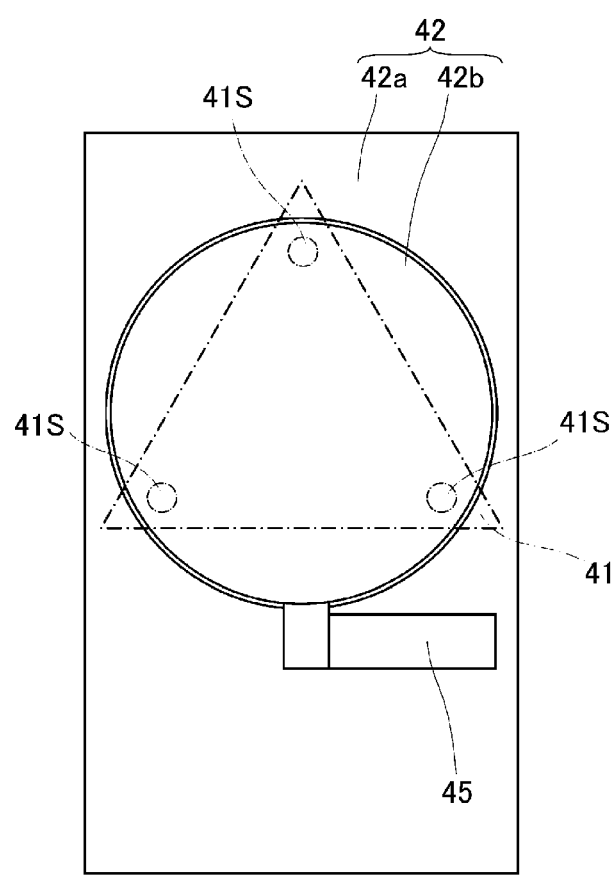
FIG. 12 shows a rotary mechanism portion viewed from a side of the holder portion.

The holder portion 41 is secured on the rotary mechanism portion 42. FIG. 12 shows the rotary mechanism portion 42 viewed from a side of the holder portion 41. The rotary mechanism portion 42 in this example includes a stationary plate 42a and a rotary stage 42b, and the holder portion 41 is secured on the rotary stage 42b by a plurality of screws 41S. The screws 41S secure the holder portion 41 on the rotary stage 42b in positions not overlapping the prism 64. In this embodiment, the number of the screws 41S is three like the number of side surfaces of the prism 64.

The stationary plate 42a is secured on a body 61M of a casing 61. The rotary stage 42b is, for example, a circular plate-like member, and rotates around a predetermined axis in an in-plane direction of a main surface of the stationary plate 42a. The stationary plate 42a and the rotary stage 42b are connected, for example, by a hinge or a cross roller bearing. Since the hinge is movable in a smaller range but is lighter in weight than the cross roller bearing, the hinge is preferable in terms of fast operation of the rotary stage 42b. The in-plane direction of the main surface of the stationary plate 42a is parallel to the bottom surface 64B of the prism 64. Thus, an axis RA4 around which the rotary stage 42b rotates is perpendicular to a dispersion plane of light emitted from the prism 64. When the rotary stage 42b rotates, the holder portion 41 secured on the rotary stage 42b and the prism 64 secured on the holder portion 41 rotate together with the rotary stage 42b around the axis RA4 perpendicular to the dispersion plane of the light emitted from the prism 64.

In this embodiment, with the prism 64 being secured on the holder portion 41, a centroid G64 of the prism 64, a centroid G41 of the holder portion 41, and a centroid G42b of the rotary stage 42b are located on the axis RA4 around which the prism 64, the holder portion 41, and the rotary stage 42b rotate. The axis RA4 is surrounded by the adhesive portions of the adhesive 46 that secure the prism 64 on the holder portion 41, and also surrounded by the screws 41S that secure the holder portion 41 on the rotary stage 42b.

A piezo actuator 45 is secured on the stationary plate 42a. The piezo actuator 45 is connected to the rotary stage 42b. Thus, the piezo actuator 45 is operated to change a connection between the piezo actuator 45 and the rotary stage 42b, thereby slightly rotating the rotary stage 42b. Thus, in this embodiment, the piezo actuator 45 is a drive unit that rotates the rotary stage 42b. The piezo actuator 45 is operated to slightly rotate the prism 64 and change an orientation of the prism 64.

In this embodiment, a rotation angle of the prism 64 due to the operation of the piezo actuator 45 is smaller than that of the prism 65 due to the operation of the stepping motor 74. In other words, the stepping motor 74 is a drive unit for coarse motion and the piezo actuator 45 is a drive unit for fine motion. The stepping motor 74 is operated to coarsely adjust an optical path, and the piezo actuator 45 is operated to finely adjust the optical path.

A driver DR is electrically connected to the piezo actuator 45. In this embodiment, the driver DR drives the stepping motor 74 and the piezo actuator 45 according to a signal from the control unit CO.

3.2 Operation

Next, operation of the gas laser apparatus 100 of this embodiment will be described.

In the gas laser apparatus 100 of this embodiment, a laser beam is emitted through a laser beam exit window OW as in the gas laser apparatus 100 of the comparative example.

At this time, in this embodiment, the control unit CO controls the driver DR according to a signal received from a wavelength monitor 23 and a signal received from an exposure apparatus 200, and the driver DR drives the stepping motor 74 and the piezo actuator 45. The stepping motor 74 is driven to change a tilt of the lever 76, thereby rotating the rotary stage 72b. A rotation angle is, for example, similar to that of the rotary stage 72b in the comparative example. The rotary stage 72b rotates to rotate the holder portion 71 secured on the rotary stage 72b and the prism 65 secured on the holder portion 71 together with the rotary stage 72b, thereby changing the orientation of the prism 65. Also, the piezo actuator 45 is driven to rotate the rotary stage 42b. A rotation angle is, for example, in the range of ±0.01 degrees. The rotary stage 42b rotates to rotate the holder portion 41 secured on the rotary stage 42b and the prism 64 secured on the holder portion 41 together with the rotary stage 42b, thereby changing the orientation of the prism 64.

The orientations of the prisms 64, 65 are changed to adjust a wavelength of light reflected by a grating 62 and returning into a casing 30 of the chamber device CH. In other words, the control unit CO adjusts rotation angles of the prisms 64, 65 according to the signal from the wavelength monitor 23 and the signal from the exposure apparatus 200, and performs feedback control such that the light emitted from the gas laser apparatus 100 has a wavelength desired by the exposure apparatus 200.

3.3 Effect

In the line narrowing module 60 of this embodiment, the rotary stage 42b rotates around the axis RA4 perpendicular to the dispersion plane of the light emitted from the prism 64, and the centroid G64 of the prism 64, the centroid G41 of the holder portion 41, and the centroid G42b of the rotary stage 42b are located on the axis RA4. This can suppress whirling of the prism 64, the holder portion 41, and the rotary stage 42b. Thus, rotation responses of the prism 64, the holder portion 41, and the rotary stage 42b in this embodiment are faster than those of the prism 65, the holder portion 71, and the rotary stage 72b in the comparative example. Since the rotation response of the prism 65 is fast, time for fine adjustment of the optical path can be reduced, thereby suppressing instability of the wavelength of the laser beam emitted from the gas laser apparatus 100. Thus, the line narrowing module 60 of this embodiment can achieve the gas laser apparatus 100 capable of stabilizing the wavelength of the laser beam.

The bottom surface 64B of the prism 64 in this embodiment has the triangular shape, and the apexes of the bottom surface 64B do not overlap the stationary surface 41F of the holder portion 41. Thus, a size of the stationary surface 41F can be reduced and a size of the holder portion 41 can be reduced. This can reduce an inertial force of the holder portion 41 to rotation and provide a faster rotation response. When the reduction in size of the holder portion 41 is not required, the entire bottom surface 64B of the prism 64 may overlap the stationary surface 41F.

The prism 64 is secured on the holder portion 41 with the adhesive 46. The adhesive 46 is lighter in weight than the plurality of members for securing the prism 65 on the holder portion 71 in the comparative example. Thus, a weight of a connection between the holder portion 41 and the prism 64 can be reduced. This can provide a faster rotation response of the holder portion 41. When a heavier member than the adhesive is allowed to be used, the prism 64 may be secured on the holder portion 41 with a member other than the adhesive.

The adhesive 46 is separated into the plurality of dot-like adhesive portions. This can reduce the weight of the adhesive 46, and suppress a rotation response from being slowed due to the weight of the adhesive 46. The axis RA4 is surrounded by the adhesive 46, thereby suppressing whirling due to the weight of the adhesive 46 as compared to when the axis RA4 is not surrounded by the adhesive. The adhesive 46 may be arranged in a ring shape to surround the axis RA4. When an amount of the adhesive 46 used is allowed to be increased, the adhesive 46 may be applied to the entire overlapping region of the bottom surface 64B of the prism 64 and the holder portion 41.

The prism 64 includes the light shielding film 64S provided on one bottom surface 64B. This can suppress part of the light entering the prism 64 from reaching the adhesive 46, and suppress degradation of the adhesive 46 due to the light. The light shielding film 64S needs not be provided on the bottom surface 64B of the prism 64.

The axis RA4 of rotation is surrounded by the screws 41S that secure the holder portion 41 on the rotary stage 42b. This can suppress whirling due to the weight of the screws 41S as compared to when the axis RA4 is not surrounded by the screws 41S that secure the holder portion 41 on the rotary stage 42*b*. The holder portion 41 may be secured on the rotary stage 42*b* with a securing member other than the screws. Even if the holder portion 41 is secured on the rotary stage 42*b* with the screws 41S, the axis RA4 needs not be surrounded by the screws 41S.

Figure 13:
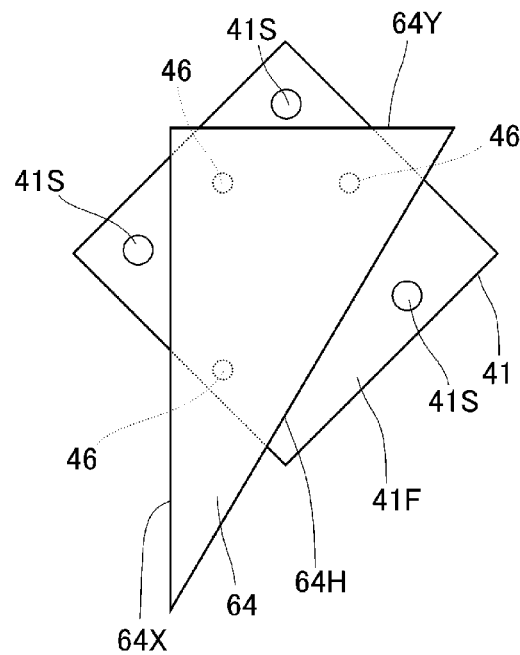
FIG. 13 shows the prism being secured on the holder portion in a line narrowing module of a first variant of Embodiment 1 in the same manner as in FIG. 9.
Figure 14:
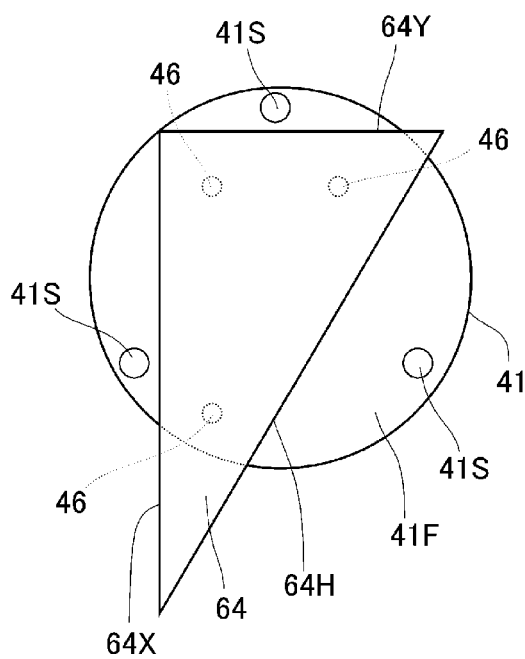
FIG. 14 shows the prism being secured on the holder portion in a line narrowing module of a second variant of Embodiment 1 in the same manner as in FIG. 9.

In this embodiment, the triangular stationary surface 41F of the holder portion 41 has been described. However, the stationary surface 41F needs not have a triangular shape. FIG. 13 shows the prism 64 being secured on the holder portion 41 in a line narrowing module of a first variant of this embodiment in the same manner as in FIG. 9. The holder portion 41 in this variant is different from the holder portion 41 in the above embodiment in that the stationary surface 41F has a rectangular shape. The stationary surface 41F in this example has a square shape. FIG. 14 shows the prism 64 being secured on the holder portion 41 in a line narrowing module of a second variant of this embodiment in the same manner as in FIG. 9. The holder portion 41 in this variant is different from the holder portion 41 in the above embodiment in that the stationary surface 41F has a circular shape. Also in these variants, the centroid G64 of the prism 64, the centroid G41 of the holder portion 41, and the centroid G42*b* of the rotary stage 42*b* are located on the axis RA4 around which the prism 64, the holder portion 41, and the rotary stage 42*b* rotate.

4. Description of Line Narrowing Module of Embodiment 2

Next, a line narrowing module of Embodiment 2 will be described. The same components as those described above are denoted by the same reference numerals, and overlapping descriptions are omitted unless otherwise stated.

4.1 Configuration

Figure 15:
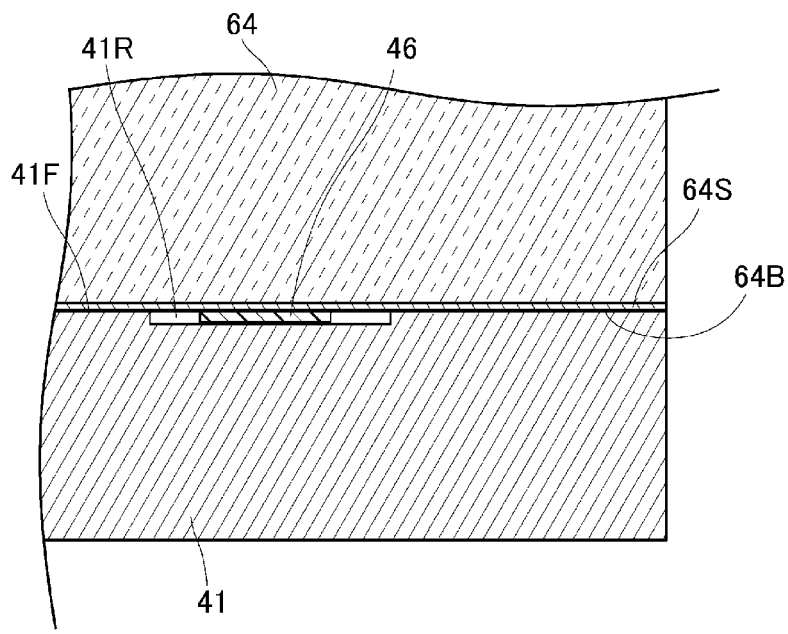
FIG. 15 shows a prism and a holder portion being secured with an adhesive in a line narrowing module of Embodiment 2 in the same manner as in FIG. 11.

FIG. 15 shows the prism 64 and the holder portion 41 being secured with the adhesive 46 in the line narrowing module of this embodiment in the same manner as in FIG. 11. Also in this embodiment, as in Embodiment 1, the prism 64 and the holder portion 41 are bonded with the adhesive 46 separated into the plurality of adhesive portions. The stationary surface 41F of the holder portion 41 in this embodiment has a recess 41R in a position overlapping part of the bottom surface 64B of the prism 64. The recess 41R is provided in a region including the position of the adhesive 46 in FIG. 9. Thus, recesses 41R are provided in three regions. As shown in FIG. 15, the adhesive 46 is arranged in each recess 41R to secure the prism 64 on the holder portion 41.

The bottom surface 64B of the prism 64 is in contact with the stationary surface 71F around each recess 41R.

4.2 Effect

In this embodiment, the bottom surface 64B of the prism 64 is in contact with the stationary surface 71F around each recess 41R. Thus, a tilt of the prism 64 relative to the stationary surface 71F is suppressed. This can suppress improper bending of the optical path of the light passing through the prism 64.

In this embodiment, the adhesive 46 is arranged in each recess 41R. This can suppress unnecessary spreading of the adhesive 46 as compared to when no recess 41R is provided.

5. Description of Line Narrowing Module of Embodiment 3

Next, a line narrowing module of Embodiment 3 will be described. The same components as those described above are denoted by the same reference numerals, and overlapping descriptions are omitted unless otherwise stated.

5.1 Configuration

Figure 16:
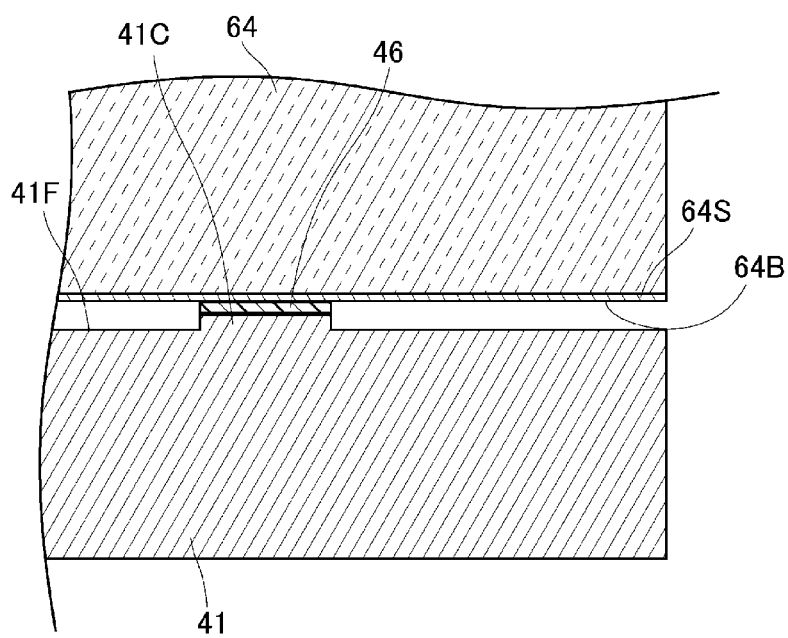
FIG. 16 shows a prism and a holder portion being secured with an adhesive in a line narrowing module of Embodiment 3 in the same manner as in FIG. 11.

FIG. 16 shows the prism 64 and the holder portion 41 being secured with the adhesive 46 in the line narrowing module of this embodiment in the same manner as in FIG. 11. Also in this embodiment, as in Embodiment 1, the prism 64 and the holder portion 41 are bonded with the adhesive 46 separated into the plurality of adhesive portions. The stationary surface 41F of the holder portion 41 in this embodiment has a projection 41C in a position overlapping part of the bottom surface 64B of the prism 64. The projection 41C is provided in a region including the position of the adhesive 46 in FIG. 9. Thus, projections 41C are provided in three regions. As shown in FIG. 16, the adhesive 46 is arranged on each projection 41C to secure the holder portion 41 and the prism 64.

Thus, the bottom surface 64B of the prism 64 is spaced apart from the stationary surface 41F, and a space is formed in a region around each projection 41C between the bottom surface 64B of the prism 64 and the stationary surface 41F.

5.2 Effect

In this embodiment, the adhesive 46 is arranged on each projection 41C. Thus, even if a large amount of adhesive 46 is arranged, an unnecessary adhesive 46 accumulates on the region around the projection 41C, which is one step lower. This can suppress unnecessary spreading of the adhesive 46.

Various changes can be made to the embodiments and the variants of the present disclosure.

For example, the prism 65 rotated by driving of the stepping motor 74 may be secured on the holder portion 71 with an adhesive. With the prism 65 being secured on the holder portion 71, the centroid of the prism 65, the centroid of the holder portion 71, and the centroid of the rotary stage 72*b* may be located on the axis RA5 around which the prism 65, the holder portion 71, and the rotary stage 72*b* rotate.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:
1. A line narrowing module comprising:
   a prism including an entrance side surface that light enters, an exit side surface from which the light is emitted, and a bottom surface, and configured to wavelength-disperse the light having entered the entrance side surface and to emit the light from the exit side surface;

a holder portion having a stationary surface on which the bottom surface of the prism is secured with an adhesive, the stationary surface having a recess in a region overlapping part of the bottom surface of the prism and the adhesive is arranged in the recess;

a rotary mechanism portion including a rotary stage on which the holder portion is secured, the rotary stage being configured to rotate the prism around an axis perpendicular to a dispersion plane of the light emitted from the prism;

a drive unit configured to rotate the rotary stage; and a grating configured to reflect the light emitted from the prism, a centroid of the prism, a centroid of the holder portion, and a centroid of the rotary stage being located on the axis.

2. The line narrowing module according to claim 1, wherein the bottom surface of the prism has a polygonal shape, and at least one apex of the bottom surface of the prism does not overlap the stationary surface of the holder portion.

3. The line narrowing module according to claim 2, wherein the bottom surface of the prism has a triangular shape, and apexes of the bottom surface do not overlap the stationary surface of the holder portion.

4. The line narrowing module according to claim 3, wherein the stationary surface of the holder portion has a triangular shape.

5. The line narrowing module according to claim 1, wherein the axis is surrounded by the adhesive.

6. The line narrowing module according to claim 5, wherein the adhesive is separated into a plurality of dot-like adhesive portions, and the axis is surrounded by the adhesive portions.

7. The line narrowing module according to claim 6, wherein the adhesive is separated into three adhesive portions.

8. The line narrowing module according to claim 1, wherein the bottom surface is in contact with the stationary surface around the recess.

9. The line narrowing module according to claim 1, wherein the prism includes a light shielding film provided on the bottom surface.

10. The line narrowing module according to claim 1, wherein the holder is secured on the rotary stage with a plurality of screws.

11. The line narrowing module according to claim 10, wherein the axis is surrounded by the screws.

12. The line narrowing module according to claim 11, wherein the number of the screws is three.

13. The line narrowing module according to claim 1, wherein the drive unit includes a piezoelectric substance.

14. A line narrowing module comprising:

a prism including an entrance side surface that light enters, an exit side surface from which the light is emitted, and a bottom surface, and configured to wavelength-disperse the light having entered the entrance side surface and to emit the light from the exit side surface;

a holder portion having a stationary surface on which the bottom surface of the prism is secured with an adhesive, the adhesive being applied to part of the bottom surface of the prism, and the bottom surface is spaced apart from the stationary surface of the holder portion;

a rotary mechanism portion including a rotary stage on which the holder portion is secured, the rotary stage being configured to rotate the prism around an axis perpendicular to a dispersion plane of the light emitted from the prism;

a drive unit configured to rotate the rotary stage; and a grating configured to reflect the light emitted from the prism, a centroid of the prism, a centroid of the holder portion, and a centroid of the rotary stage being located on the axis.

15. The line narrowing module according to claim 14, wherein the stationary surface of the holder has a projection in a region overlapping part of the bottom surface of the prism, and the adhesive is arranged on the projection.

16. A gas laser apparatus comprising a line narrowing module, the line narrowing module including:

a prism including an entrance side surface that light enters, an exit side surface from which the light is emitted, and a bottom surface, and configured to wavelength-disperse the light having entered the entrance side surface and to emit the light from the exit side surface;

a holder portion having a stationary surface on which the bottom surface of the prism is secured with an adhesive, the stationary surface having a recess in a region overlapping part of the bottom surface of the prism and the adhesive is arranged in the recess;

a rotary mechanism portion including a rotary stage on which the holder portion is secured, the rotary stage being configured to rotate the prism around an axis perpendicular to a dispersion plane of the light emitted from the prism;

a drive unit configured to rotate the rotary stage; and a grating configured to reflect the light emitted from the prism, a centroid of the prism, a centroid of the holder portion, and a centroid of the rotary stage being located on the axis.

17. An electronic device manufacturing method using a line narrowing module, the line narrowing module including a prism including an entrance side surface that light enters, an exit side surface from which the light is emitted, and a bottom surface, and configured to wavelength-disperse the light having entered the entrance side surface and to emit the light from the exit side surface, a holder portion having a stationary surface on which the bottom surface of the prism is secured with an adhesive, the stationary surface having a recess in a region overlapping part of the bottom surface of the prism and the adhesive is arranged in the recess, a rotary mechanism portion including a rotary stage on which the holder portion is secured, the rotary stage being configured to rotate the prism around an axis perpendicular to a dispersion plane of the light emitted from the prism, a drive unit configured to rotate the rotary stage, and a grating configured to reflect the light emitted from the prism, a centroid of the prism, a centroid of the holder portion, and a centroid of the rotary stage being located on the axis, the prism being secured on the holder portion with an adhesive, the stationary surface of the holder portion including a recess in a region overlapping part of the bottom surface of the prism, and the adhesive being arranged in the recess, the electronic device manufacturing method comprising:

generating a laser beam in a gas laser apparatus including the line narrowing module;

outputting the laser beam to an exposure apparatus; and exposing a photosensitive substrate to the laser beam within the exposure apparatus to manufacture an electronic device.

\* \* \* \* \*